(12) United States Patent
Kawaguchi

(10) Patent No.: US 12,418,304 B2
(45) Date of Patent: Sep. 16, 2025

(54) A/D CONVERTER AND SEMICONDUCTOR DEVICE

(71) Applicant: RENESAS ELECTRONICS CORPORATION, Tokyo (JP)

(72) Inventor: Takumi Kawaguchi, Tokyo (JP)

(73) Assignee: RENESAS ELECTRONICS CORPORATION, Tokyo (JP)

(\*) Notice: Subject to any disclaimer, the term of this patent is extended or adjusted under 35 U.S.C. 154(b) by 230 days.

(21) Appl. No.: 18/304,000

(22) Filed: Apr. 20, 2023

(65) Prior Publication Data

US 2023/0396261 A1 Dec. 7, 2023

(30) Foreign Application Priority Data

Jun. 3, 2022 (JP) .................. 2022-090982

(51) Int. Cl.
| | |
|---|---|
| H03M 1/46 | (2006.01) |
| H03M 1/06 | (2006.01) |
| H03M 1/10 | (2006.01) |
| H03M 1/12 | (2006.01) |
| H03M 1/38 | (2006.01) |

(52) U.S. Cl.
CPC ............ *H03M 1/46* (2013.01); *H03M 1/0692* (2013.01); *H03M 1/1009* (2013.01); *H03M 1/12* (2013.01); *H03M 1/38* (2013.01)

(58) Field of Classification Search
CPC ........ H03M 1/46; H03M 1/1009; H03M 1/38; H03M 1/0692; H03M 1/12; H03M 1/00
See application file for complete search history.

(56) References Cited

U.S. PATENT DOCUMENTS

| | | | |
|---|---|---|---|
| 6,717,542 B2 | 4/2004 | Harada | |
| 8,760,335 B1* | 6/2014 | Kappes | ................... H03M 1/12 |
| | | | 341/155 |
| 2019/0222219 A1* | 7/2019 | Wen | ...................... H03M 1/403 |

FOREIGN PATENT DOCUMENTS

JP 2003-283336 A 10/2003

\* cited by examiner

*Primary Examiner* — Joseph J Lauture
(74) *Attorney, Agent, or Firm* — Rimon P.C.

(57) ABSTRACT

According to one embodiment, an A/D converter includes a successive approximation algorithm setting register that stores a plurality of successive approximation algorithms, an algorithm selection unit that selects a predetermined successive approximation algorithm from the plurality of successive approximation algorithms, a control circuit that generates a comparison value based on the selected predetermined successive approximation algorithm, a DAC that generates a comparison voltage from the comparison value, and a comparator that compares an analog input voltage with the comparison voltage. The control circuit generates a comparison value from a result of the comparison made by the comparator based on the selected predetermined successive approximation algorithm, and converts an analog input voltage into a digital signal from the result of the comparison made by the comparator the number of times equal to the number of bits of the digital signal.

16 Claims, 9 Drawing Sheets

A/D CONVERTER AND SEMICONDUCTOR DEVICE

CROSS-REFERENCE TO RELATED APPLICATIONS

The present application claims priority from Japanese Patent Application No. 2022-090982 filed on Jun. 3, 2022, the content of which is hereby incorporated by reference to this application.

BACKGROUND

The present disclosure relates to an A/D converter and a semiconductor device.

Patent document 1 (Japanese Patent Application Laid-open No. 2003-283336) discloses a successive approximation type A/D converter.

SUMMARY

It is desired to improve accuracy of A/D conversion by an A/D converter.

Other problems and novel features will be apparent from the description of the present specification and the accompanied drawings.

According to one embodiment, an A/D converter includes: a successive approximation algorithm setting register storing a plurality of successive approximation algorithms; an algorithm selection unit selecting a predetermined successive approximation algorithm from the plurality of successive approximation algorithms; a control circuit generating a comparison value based on the selected predetermined successive approximation algorithm; a DAC generating a comparison voltage from the comparison value; and a comparator making a comparison of an analog input voltage and the comparison voltage. The control circuit: generates the comparison value from a result of the comparison made by the comparator based on the selected predetermined successive approximation algorithm; and converses the analog input voltage into the digital signal from the result of the comparison made by the comparator only at least a number of times equal to a number of bits of digital signals.

According to one embodiment, a semiconductor device includes an A/D converter, the A/D converter includes: a successive approximation algorithm setting register storing a plurality of successive approximation algorithms; an algorithm selection unit selecting a predetermined successive approximation algorithm from the plurality of successive approximation algorithms; a control circuit generating a comparison value based on the selected predetermined successive approximation algorithm; a DAC generating a comparison voltage from the comparison value; and a comparator making a comparison of an analog input voltage and a comparison voltage. The control circuit: generates the comparison value from the result of the comparison made by the comparator based on the selected predetermined successive approximation algorithm; and converts the analog input voltage into the digital signal from the result of the comparison made by the comparator at least a number of times equal to a number of bits of the digital signal.

According to the above-mentioned embodiment, an A/D converter and a semiconductor device, which are capable of improving accuracy of A/D conversion, can be provided.

DETAILED DESCRIPTION

Figure 1:
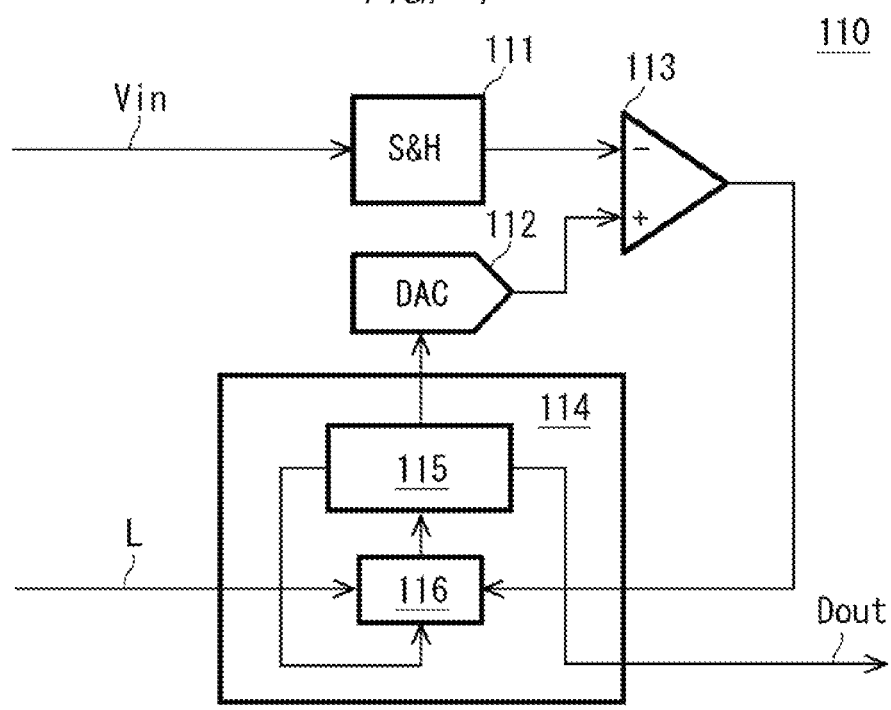
FIG. 1 is a block drawing exemplifying an A/D converter according to a first comparative example.

For clarity of explanation, the following descriptions and drawings are omitted and simplified as appropriate. Moreover, in each drawing, the same elements are denoted by the same reference numerals, and a redundant description thereof will be omitted as necessary.

First, analog/digital converters (referred to as A/D converters) according to first and second comparative examples and a problem(s) discovered by the inventor will be described. Thereafter, an A/D converter and a semiconductor device according to an embodiment(s) will be described. Incidentally, the A/D converters according to the first and second comparative examples and their problems are also included in the scope of the technical concept of the embodiment.

First Comparative Example: Successive Approximation Type A/D Converter

FIG. 1 is a block diagram exemplifying an A/D converter according to a first comparative example. As shown in FIG.

1, an A/D converter 110 of a comparative example includes a sample hold circuit 111, a DAC (Digital to Analog Converter) 112, a comparator 113, and a control circuit 114. The control circuit 114 has a successive approximation register 115 and an addition/subtraction circuit 116. The A/D converter 110 sequentially compares an analog input voltage Vin with a comparison voltage generated by the DAC 112 to output a digital signal Dout.

The sample hold circuit 111 holds and samples the inputted analog input voltage Vin. The sample hold circuit 111 outputs the sampled analog input voltage Vin to the comparator 113. The DAC 112 converts a comparison value of a digital value to be compared, which is outputted from the control circuit 114, into an analog value to generate a comparison voltage. The DAC 112 outputs the generated comparison voltage to the comparator 113.

The comparator 113 compares the analog input voltage Vin outputted from the sample hold circuit 111 and the comparison voltage outputted from the DAC 112. The comparator 113 outputs a comparison result(s) to the control circuit 114. The control circuit 114 generates a comparison value(s) based on the successive approximation algorithm. Also, the control circuit 114 generates a comparison value from the comparison result of the comparator 113 based on the successive approximation algorithm. Furthermore, the control circuit 114 converts an analog input voltage Vin into the digital signal Dout based on a result(s) of the comparison made by the number of times corresponding (equal to) to the number of bits of the digital signal Dout based on the successive approximation algorithm.

The successive approximation algorithm indicates how the comparison value generated by the control circuit 114 is generated. For example, in a general successive approximation algorithm, a change amount L to be added to or subtracted from the comparison value is sequentially changed every ½ from ½ of the maximum value of the digital signal Dout. Such a successive approximation algorithm is called a binary search algorithm.

The addition/subtraction circuit 116 adds/subtracts the change amount L to/from the comparison value based on the comparison result of the comparator 113. The successive approximation register 115 sequentially outputs a comparison value(s), which is obtained by adding/subtracting the change amount L by the adding/subtracting circuit 116, to the DAC 112. Consequently, the DAC 112 successively converts the comparison values into the comparison voltages. Therefore, the comparator 113 compares the analog input voltage Vin with the comparison voltage. Such comparison and addition/subtraction of the comparison value are repeated as many times as the number of bits of the digital signal Dout.

Figure 2:
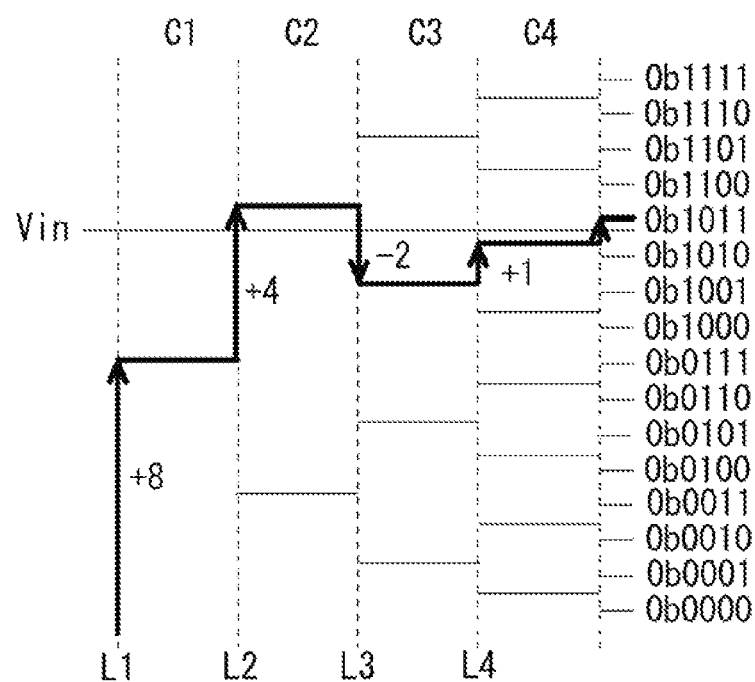
FIG. 2 is a drawing exemplifying an A/D conversion result calculated by a binary search algorism in the A/D converter according to the first comparative example.

FIG. 2 is a diagram exemplifying an A/D conversion result, which is calculated by a binary search algorithm, in an A/D converter 110 according to a first comparative example. As shown in FIG. 2, when the A/D converter 110 converts the analog input voltage Vin into a 4-bit digital signal Dout, the comparator 113 performs comparison of the analog input voltage Vin and the comparison voltage C1 four times as Comparisons C1 and C2.

First, in first comparison C1, the addition/subtraction circuit 116 adds a change amount L1 with respect to an initial value of the comparison value. The change amount L1 with respect to the initial value is ½ of the maximum value of the digital signal Dout. Therefore, the successive approximation register 115 generates ½ of the maximum value of the digital signal Dout as a comparison value. For example, in a case of a 4-bit digital signal Dout, the successive approximation register 115 generates a digital value with the most significant bit set to "1". The DAC 112 converts the comparison value outputted from the successive approximation register 115 into a comparison voltage. The DAC 112 outputs, for example, 8 [V] to the comparator 113 as a comparison voltage. The comparator 113 compares the analog input voltage Vin with a comparison voltage of 8 [V]. As shown in the figure, in Comparison C1, the analog input voltage Vin is higher. Therefore, the addition/subtraction circuit 116 adds the next change amount L2 to the comparison value based on the comparison result of the comparator 113. The next change amount L2 is ¼ of the maximum value of the digital signal Dout. Also, the successive approximation register 115 determines the most significant bit as "1".

Next, in second Comparison C2, the successive approximation register 115 generates a comparison value to which the change amount L2 is added. For example, in a case of a 4-bit digital signal Dout, the successive approximation register 115 generates a digital value in which the second most significant bit is "1". The DAC 112 converts the comparison value outputted from the successive approximation register 115 into a comparison voltage. The DAC 112 outputs 12 [V], which is obtained by adding (+4) the change amount L2, to the comparator 113 as a comparison voltage. A comparator 113 compares the analog input voltage Vin with a comparison voltage of 12 [V]. As shown in the figure, in Comparison C2, the analog input voltage Vin is smaller. Therefore, the addition/subtraction circuit 116 subtracts the next change amount L3 from the comparison value based on the comparison result of the comparator 113. The next change amount L3 is ⅛ of the maximum value of the digital signal Dout. Also, the successive approximation register 115 determines the second most significant bit as "0".

Next, in third Comparison C3, the successive approximation register 115 generates a comparison value with the change amount L3 subtracted. For example, in the case of a 4-bit digital signal Dout, the successive approximation register 115 generates a digital value with the third most significant bit set to "1". The DAC 112 converts the comparison value outputted from the successive approximation register 115 into a comparison voltage. The DAC 112 outputs 10 [V], which is obtained by subtracting (−2) the change amount L3, to the comparator 113 as a comparison voltage. The comparator 113 compares the analog input voltage Vin with a comparison voltage of 10 [V]. As shown in the figure, in Comparison C3, the analog input voltage Vin is higher. Therefore, the addition/subtraction circuit 116 adds the next change amount L4 to the comparison value based on the comparison result of the comparator 113 as described above. The next change amount L4 is 1/16 of the maximum value of the digital signal Dout. Also, the successive approximation register 115 determines the third most significant bit as "1".

Next, in fourth Comparison C4, the successive approximation register 115 generates a comparison value to which a change amount L4 is added. For example, in the case of a 4-bit digital signal Dout, the successive approximation register 115 generates a digital value in which the fourth most significant bit is "1". The DAC 112 converts the comparison value outputted from the successive approximation register 115 into a comparison voltage. The DAC 112 outputs 11 [V], which is obtained by adding (+1) the change amount L4, to the comparator 113 as a comparison voltage. The comparator 113 compares the analog input voltage Vin with a comparison voltage of 11 [V]. As shown in the figure, in Comparison C4, the analog input voltage Vin is higher. Therefore, based on the comparison result of the comparator 113, the successive approximation register 115 determines the fourth most significant bit as "1". Therefore, the successive approximation register 115 outputs 1011 as the digital signal Dout.

Thus, the A/D converter 110 of the first comparative example repeatedly compares the analog input voltage Vin held by the sample hold circuit 111 with the comparison voltage generated by the DAC 112 based on the binary search algorithm. Consequently, the analog input voltage Vin is converted into the digital value Dout. The comparison value to be set in the DAC 112 is set in the successive approximation register 115.

The binary search algorithm sequentially changes the change amount L, which sequentially changes the comparison value, every ½ from ½ of the maximum value of the digital signal Dout in the comparison made for the number of times equal to the number of bits of the digital signal Dout. Then, depending on the comparison result of the comparator 113, the change amount is added or subtracted to or from the comparison value. That is, the binary search algorithm compares the analog input voltage Vin with the comparison voltage only the preset number of times equal to the number of bits in the digital signal Dout and, in each comparison, the comparison voltage is reduced every predetermined multiple of a base voltage width in a predetermined sequence.

Second Comparative Example: Insertion of Redundant Successive Approximation

Figure 3:
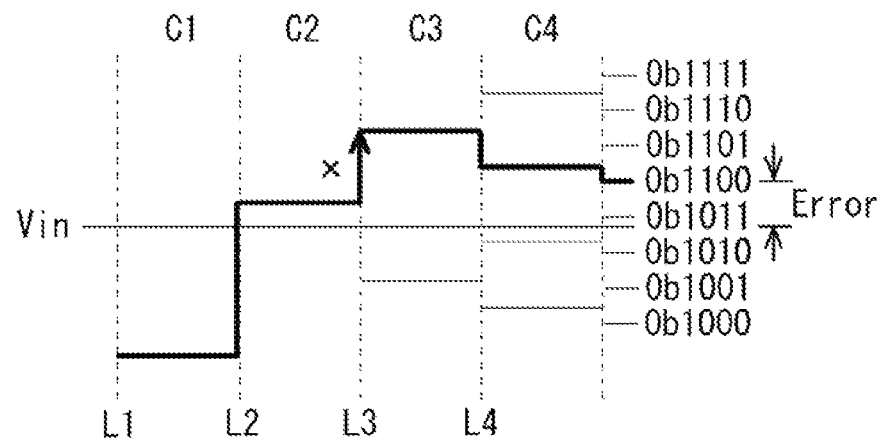
FIG. 3 is a drawing exemplifying an A/D conversion result calculated by a binary search in an A/D converter according to a second comparative example when an erroneous determination exists on the way of comparison.

Next, an A/D converter according to a second comparative example will be described. A redundant successive approximation is inserted in the A/D converter of this comparative example. FIG. 3 is a drawing exemplifying an A/D conversion result calculated by a binary search in an A/D converter according to a second comparative example when an erroneous determination exists on the way of comparison.

As shown in FIG. 3, the A/D conversion by the binary search algorithm of this comparative example includes erroneous determinations in Comparisons C2 and C3. In Comparison C2, since the analog input voltage Vin is smaller than the comparison voltage, the change amount L3 should be −2, but a change amount L3 is +2. In this way, if there is the erroneous determination in the way of the comparison, an error Error increases after passing through the Comparisons C1 to C4.

Figure 4:
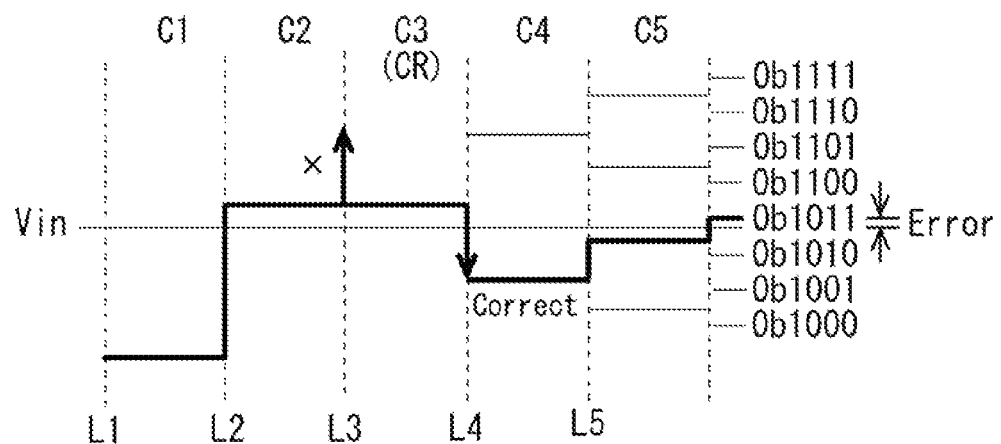
FIG. 4 is a diagram exemplifying an A/D conversion result calculated by a successive approximation algorithm that corrects an erroneous determination by an inserted redundant cycle in the A/D converter according to the second comparative example.

FIG. 4 is a diagram exemplifying an A/D conversion result calculated by a successive approximation algorithm that corrects an erroneous determination by an inserted redundant cycle in the A/D converter according to the second comparative example. As shown in FIG. 4, in the successive approximation algorithm of this comparative example, Comparison C3 inserted during the A/D conversion is redundant comparison CR.

In Comparison C2, the comparator 113 compares the analog input voltage Vin and the comparison voltage. As shown in the figure, in Comparison C2, the analog input voltage Vin is smaller. Therefore, the addition/subtraction circuit 116 originally subtracts the next change amount L3 from the comparison value based on the comparison result of the comparator 113. However, due to the erroneous determination, the addition/subtraction circuit 116 adds the next change amount L3.

Meanwhile, in redundant Comparison C3 (CR), the comparator 113 again compares the analog input voltage Vin and the comparison voltage. As shown in the figure, the analog input voltage Vin is smaller in redundant Comparison C3 (CR). Then, the addition/subtraction circuit 116 subtracts the next change amount L4 (=L3) from the comparison value based on the comparison result of the comparator 113 as described above. Therefore, the erroneous determination can be corrected.

Thus, in the second comparative example, redundant Comparison CR is inserted between Comparison C2 and Comparison C4. Redundant Comparison CR is made the same comparison as the immediately preceding comparison. In this way, by inserting redundant Comparison CR, it is possible to correct the erroneous determination of the comparison in the A/D conversion and improve A/D conversion accuracy. Incidentally, redundant Comparison CR may be inserted not only between the comparisons, but also after a series of comparisons.

An algorithm that inserts such redundant Comparison CR is called a redundant algorithm. Inserted into the redundancy algorithm is the same redundancy comparison as the immediately preceding comparison at least between comparisons only the number of times equal to the number of bits of the digital signal Dout in the binary search algorithm and/or after comparisons only the number of times equal to the number of bits of the digital signal Dout. In the redundancy algorithm, a position of redundant Comparison CR to be inserted may be between Comparison C1 and Comparison C2, between Comparison C2 and Comparison C3, between Comparison C3 and Comparison C4, after Comparison C4, or the like, and is not limited to this. Also, the redundancy algorithm may insert one redundant Comparison CR or multiple redundant Comparisons CR.

(Problem Newly Found by the Inventor)

For example, in the A/D converters according to the first and second comparative examples, when the A/D conversion accuracy is evaluated, the inventor has found that the A/D conversion accuracy deteriorates depending on a frequency of a clock ADCLK that sets operational timing of the A/D converter. Given as this cause is, for example, self-noise generated at a clock ADCLK time having a specific frequency.

Figure 5:
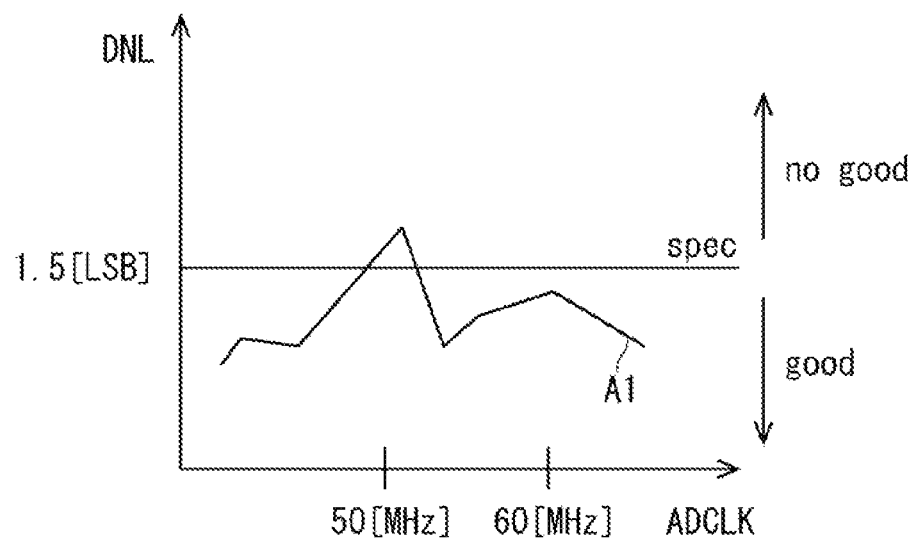
FIG. 5 is a graph exemplifying A/D conversion accuracy in a clock by a successive approximation algorithm, where a horizontal axis indicates clock frequency and a vertical axis indicates A/D conversion accuracy.
Figure 6:
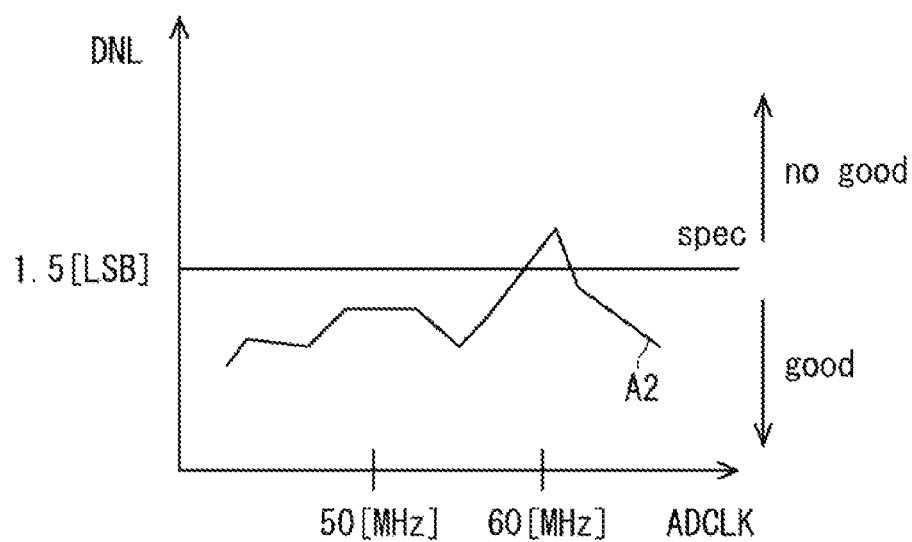
FIG. 6 is a graph exemplifying A/D conversion accuracy in a clock by a successive approximation algorithm, where a horizontal axis indicates clock frequency and a vertical axis indicates A/D conversion accuracy.

FIGS. 5 and 6 are graphs each exemplifying A/D conversion accuracy at a clock ADCLK by a successive approximation algorithm, where a horizontal axis indicates a frequency of the clock ADCLK and a vertical axis indicates A/D conversion accuracy. FIGS. 5 and 6 show each case of performing the A/D conversion by using mutually different successive approximation algorithms.

As shown in FIGS. 5 and 6, switching between the mutually different successive approximation algorithms makes it possible to improve the A/D conversion accuracy at some clock ADCLK frequencies. For example, when the successive approximation algorithm A1 shown in FIG. 5 is used, the A/D conversion accuracy can satisfy specifications of 1.5 [LSB] at a frequency of around 60 [MHz]. However, when the frequency is around 50 [MHz], the A/D conversion accuracy deteriorates more than the specification of 1.5 [LSB].

Meanwhile, as shown in FIG. 6, when the successive approximation algorithm A2 is used, the A/D conversion accuracy can satisfy the specification of 1.5 [LSB] at a frequency of around 50 [MHz]. However, when the clock frequency is around 60 MHz, the A/D conversion accuracy deteriorates more than the specification of 1.5 [LSB].

In this way, changing the settings of the successive approximation algorithms A1 and A2 improves the A/D conversion accuracy at some frequencies of the clock ADCLK, but deteriorates the A/D conversion accuracy at other frequencies of the clock ADCLK. The successive approximation algorithms A1 and A2 change the dependence of the A/D conversion accuracy with respect to the frequency of the clock ADCLK.

Outline of Embodiment: A/D Converter and Semiconductor Device

Figure 7:
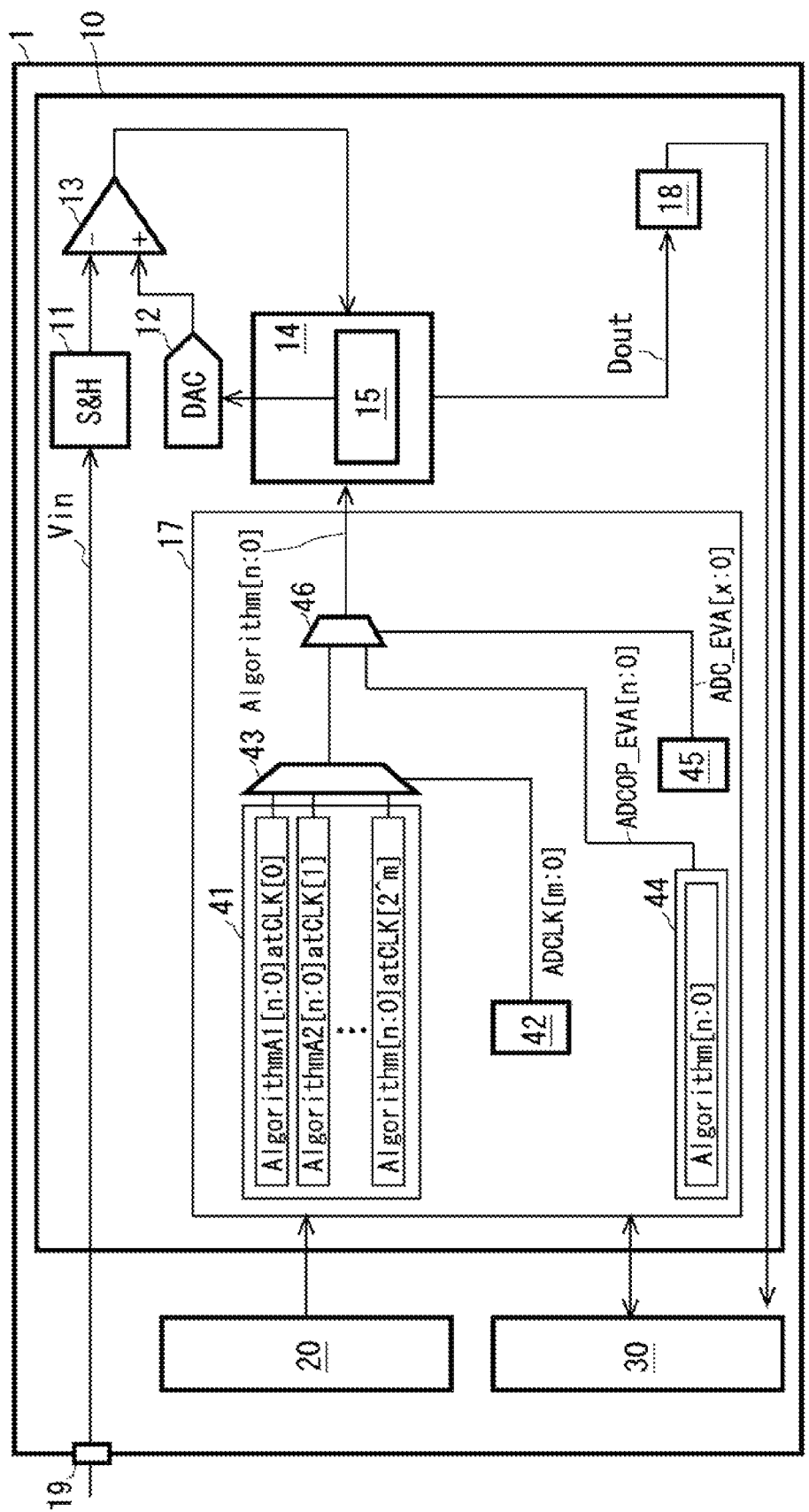
FIG. 7 is a block diagram exemplifying a semiconductor device including an A/D converter according to an outline of an embodiment.

Next, an A/D converter and a semiconductor device according to an outline of an embodiment will be described. An A/D conversion circuit of the present embodiment has a function of switching the successive approximation algorithm according to the frequency of the clock ADCLK to be set. FIG. 7 is a block diagram exemplifying a semiconductor device including an A/D converter according to an outline of an embodiment. As shown in FIG. 7, a semiconductor device 1 includes an A/D converter 10, a storage unit 20, a processor 30, and a terminal 19. The A/D converter 10 sequentially compares the analog input voltage Vin with the comparison voltage generated by the DAC 12 to output a digital signal Dout.

The A/D converter 10 includes a sample hold circuit 11, a DAC 12, a comparator 13, a control circuit 14, an A/D conversion control register 17, and a data register. The control circuit 14 has a successive approximation register 15. The A/D conversion control register 17 has a successive approximation algorithm setting register 41, a clock setting register 42, an algorithm selection unit 43, an evaluation successive approximation algorithm setting register 44, an evaluation mode setting register 45, and a mode selection unit 46.

The analog input voltage Vin inputted to the semiconductor device 1 is inputted to the sample hold circuit 11 via the terminal 19. The sample hold circuit 11 holds and samples the inputted analog input voltage Vin. The sample hold circuit 11 outputs the sampled analog input voltage Vin to the comparator 13.

The DAC 12 converts the comparison value of the digital value to be compared, which is outputted from the control circuit 14, into an analog value to generate a comparison voltage. That is, the DAC 12 generates a comparison voltage from the comparison value. The DAC 112 outputs the generated comparison voltage to comparator 13.

The comparator 13 compares the analog input voltage Vin outputted from the sample hold circuit 11 and the comparison voltage outputted from the DAC 12. The comparator 13 outputs a comparison result(s) to the control circuit 14.

The control circuit 14 generates comparison values based on the successive approximation algorithm. Also, the control circuit 14 generates a comparison value from a result of comparison made by the comparator 13 based on the successive approximation algorithm. The control circuit 14 outputs the generated comparison value to the DAC 12. Furthermore, the control circuit 14 converts the analog input voltage Vin into the digital signal Dout based on a result of the comparison made by the comparator 13 at least the number of times equal to the number of bits of the digital signal Dout. The control circuit 14 outputs the converted digital signal Dout via the data register 18. The data register 18 temporarily holds the digital signal Dout and then outputs it to the processor 30. The digital signal Dout is subjected to a desired processing.

For example, the successive approximation register 15 of the control circuit 14 may generate a comparison value based on the successive approximation algorithm and output the generated comparison value to the DAC 12. Further, the successive approximation register 15 may output the digital signal Dout from a result(s) of the successive approximation.

The successive approximation algorithm setting register 41 stores a plurality of successive approximation algorithms. The plurality of successive approximation algorithms may store a plurality of mutually different successive approximation algorithms or may store the same successive approximation algorithm. For example, the successive approximation algorithm setting register 41 may include successive approximation algorithms A1 and A2 etc. that improve the A/D conversion accuracy with the clocks ADCLK within a predetermined frequency range.

As an example, the successive approximation algorithm setting register 41 may store a successive approximation algorithm A1 that improves A/D conversion accuracy in a range of 45 to 49 [MHz], and a successive approximation algorithm that improves A/D conversion accuracy in a range of 40 to 44 [MHz]. The successive approximation algorithm A1 and the successive approximation algorithm A2 are different from each other. Specifically, a frequency range of the clock ADCLK in which the successive approximation algorithm A1 improves the A/D conversion accuracy is different from a frequency range of the clock ADCLK in which the successive approximation algorithm A2 improves the A/D conversion accuracy.

Further, the successive approximation algorithm setting register 41 may store the successive approximation algorithm A1 that improves the A/D conversion accuracy in a range of 45 to 49 [MHz] and the successive approximation algorithm A1 that improves the A/D conversion accuracy in a range of 60 to 64 [MHz]. The successive approximation algorithm setting register 41 may redundantly store the same successive approximation algorithm A1 that improves the A/D conversion accuracy in two frequency ranges.

The plurality of successive approximation algorithms stored in the successive approximation algorithm setting register 41 may include at least one of a binary search algorithm and a redundancy algorithm. Also, the plurality of successive approximation algorithms may include a plurality of redundant algorithms, and each redundant algorithm may differ from each other in at least one of positions and the number of redundant Comparisons CR.

The clock setting register 42 outputs, for example, frequency information of a clock ADCLK indicating operational timing of the A/D converter 10. The clock setting register 42 outputs the frequency information of the clock ADCLK to the algorithm selection unit 43.

The algorithm selection unit 43 selects a predetermined successive approximation algorithm from the plurality of successive approximation algorithms stored in the successive approximation algorithm setting register 41. Therefore, the control circuit 14 generates a comparison value based on the predetermined successive approximation algorithm selected by the algorithm selection unit 43.

The algorithm selection unit 43 may select a predetermined successive approximation algorithm based on the frequency information outputted from the clock setting register 42. By adopting such a configuration, the A/D converter 10 can automatically switch the successive approximation algorithms depending on the frequency of the clock ADCLK to be set.

The algorithm selection unit 43 outputs the selected successive approximation algorithm to the mode selection unit 46. Incidentally, when the mode selection unit 46 selects the A/D conversion mode, the algorithm selection unit 43 may output the selected successive approximation algorithm to the control circuit 14 through the mode selection unit 46.

The evaluation successive approximation algorithm setting register 44 stores an evaluation successive approximation algorithm to be evaluated. Since the evaluation successive approximation algorithm is evaluated over all frequencies of the clock ADCLK used in the A/D converter 10, it is evaluated without depending on the frequency of the clock ADCLK. That is, the evaluation successive approximation algorithm is evaluated over each frequency associated with each successive approximation algorithm in the plurality of successive approximation algorithms stored in the successive approximation algorithm setting register 41. The evaluation successive approximation algorithm setting register 44 outputs the evaluation successive approximation algorithm to the mode selection unit 46.

The evaluation mode setting register 45 outputs evaluation mode setting information, which sets an evaluation mode, to the mode selection unit 46 when evaluating the A/D conversion accuracy.

The mode selection unit 46 selects either the A/D conversion mode or the evaluation mode based on the evaluation mode setting information outputted from the evaluation mode setting register 45. Specifically, when the mode selection unit 46 receives the evaluation mode setting information from the evaluation mode setting register 45, it selects the evaluation mode. Therefore, in that case, the mode selection unit 46 selects the evaluation successive approximation algorithm and outputs it to the control circuit 14. When the evaluation successive approximation algorithm is selected by the mode selection unit 46, the control circuit 14 generates a comparison value from the comparison result of the comparator 13 based on the selected evaluation successive approximation algorithm.

Meanwhile, when the mode selection unit 46 does not receive the evaluation mode setting information from the evaluation mode setting register 45, it selects the A/D conversion mode. Therefore, the mode selection unit 46 outputs the successive approximation algorithm, which is outputted from the algorithm selection unit 43, to the control circuit 14. The control circuit 14 generates a comparison value from the comparison result of the comparator 13 based on the successive approximation algorithm selected by the algorithm selection unit 43.

In this manner, the mode selection unit 46 selects either the evaluation successive approximation algorithm or the predetermined successive approximation algorithm selected by the algorithm selection unit 43 based on the evaluation mode setting information outputted from the evaluation mode setting register 45.

The storage unit 20 is, for example, a non-volatile memory and includes a Read-Only Memory (ROM), a flash memory, a Solid-State Drive (SSD), or other memory technologies, but is not limited to these. The storage unit 20 may include a CD-ROM, a Digital Versatile Disc (DVD), a Blu-ray (registered trademark) disc, or other optical disc storages, magnetic cassettes, magnetic tapes, magnetic disc storages, or other magnetic storage devices.

The processor 30 is, for example, a CPU (Central Processing Unit), but is not limited to this. The processor 30 may include an FPGA (Field-programmable Gate Array), a quantum processor (quantum computer control chip), or the like.

Figures 8, 9:
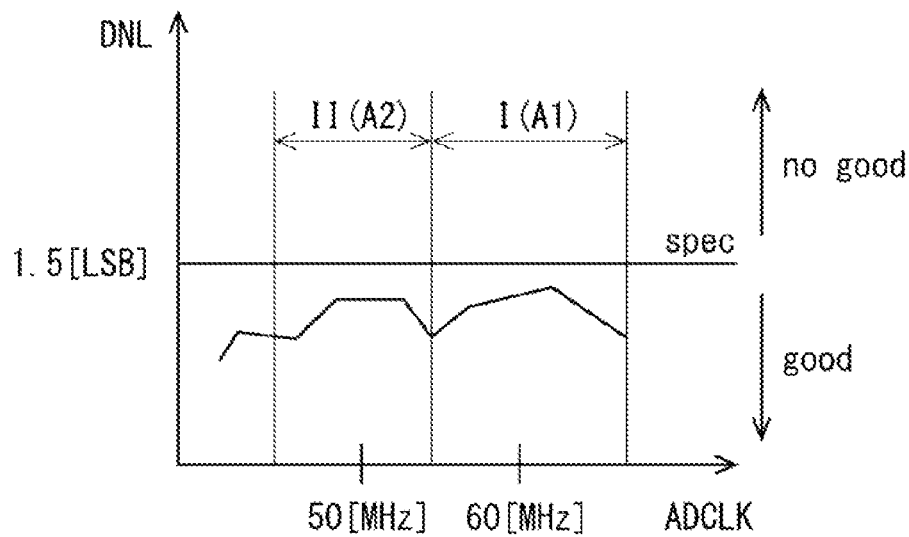
FIG. 8 is a graph exemplifying the A/D conversion accuracy when the successive approximation algorithm is switched by the setting clock in the A/D converter according to the outline of the embodiment, where a horizontal axis indicates clock frequency and a vertical axis indicates A/D conversion accuracy.
FIG. 9 is a diagram exemplifying a setting table, which is stored in a storage unit, in a semiconductor device including an A/D converter according to a first embodiment.

FIG. 8 is a graph exemplifying the A/D conversion accuracy when the successive approximation algorithm is switched by the setting clock in the A/D converter 10 according to the outline of the embodiment, where a horizontal axis indicates clock frequency and a vertical axis indicates A/D conversion accuracy. As shown in FIG. 8, a frequency range I of the clock ADCLK is set to the predetermined successive approximation algorithm A1. In this case, in the frequency range I, the A/D conversion accuracy can satisfy the specification of 1.5 [LSB]. Therefore, deterioration of the A/D conversion accuracy can be suppressed. In a case of a frequency range II of the clock ADCLK, the successive approximation algorithm A2 is set. In this case, the A/D conversion accuracy can satisfy the specification of 1.5 [LSB] in the frequency range II. Consequently, the deterioration of the A/D conversion accuracy can be suppressed. Therefore, the A/D conversion accuracy satisfies the specification of 1.5 [LSB] over the frequency range shown in the figure, so that the A/D conversion accuracy can be improved.

In this way, according to the present embodiment, switching to the optimum successive approximation algorithm is performed depending on the frequency of the clock ADCLK, so that it is possible to improve the A/D conversion accuracy over the entire frequency range of the clock ADCLK used.

First Embodiment

Next, an A/D converter and a semiconductor device according to a first embodiment will be described. In an A/D converter of this embodiment, a plurality of successive approximation algorithms stored in the successive approximation algorithm setting register 41 are transferred from the storage unit 20.

FIG. 9 is a diagram exemplifying a setting table, which is stored in a storage unit 20, in a semiconductor device 1 including an A/D converter 10 according to a first embodiment. As shown in FIG. 9, the storage unit 20 stores a plurality of successive approximation algorithms. Each successive approximation algorithm is evaluated about the dependence on the frequency of the clock ADCLK in the evaluation mode of the A/D conversion accuracy. Then, each successive approximation algorithm is associated with the optimum frequency of the clock ADCLK according to the evaluation result.

For example, the optimal successive approximation algorithm A2 that suppresses the deterioration of the A/D conversion accuracy is associated with the clock ADCLK having a frequency range of 40 to 44 [MHz]. Similarly, the successive approximation algorithm A1 is associated with the clock ADCLK having a frequency range of 45 to 49 [MHz]. The successive approximation algorithm A3 is associated with the clock ADCLK having a frequency range of 50 to 54 [MHz]. The successive approximation algorithm A4 is associated with the clock ADCLK having a frequency range of 55 to 59 [MHz]. The successive approximation algorithm A1 is associated with the clock ADCLK having a frequency range of 60 to 64 [MHz].

Thus, the storage unit 20 stores, by being written in advance, the plurality of successive approximation algorithms and combinations of the respective frequencies associated with each successive approximation algorithm. That is, the storage unit 20 stores the optimum successive approximation algorithm from the evaluation result of the A/D converter 10 in a table form. Incidentally, the storage unit 20 is also called a storage device that functions as a single unit.

Figure 10:
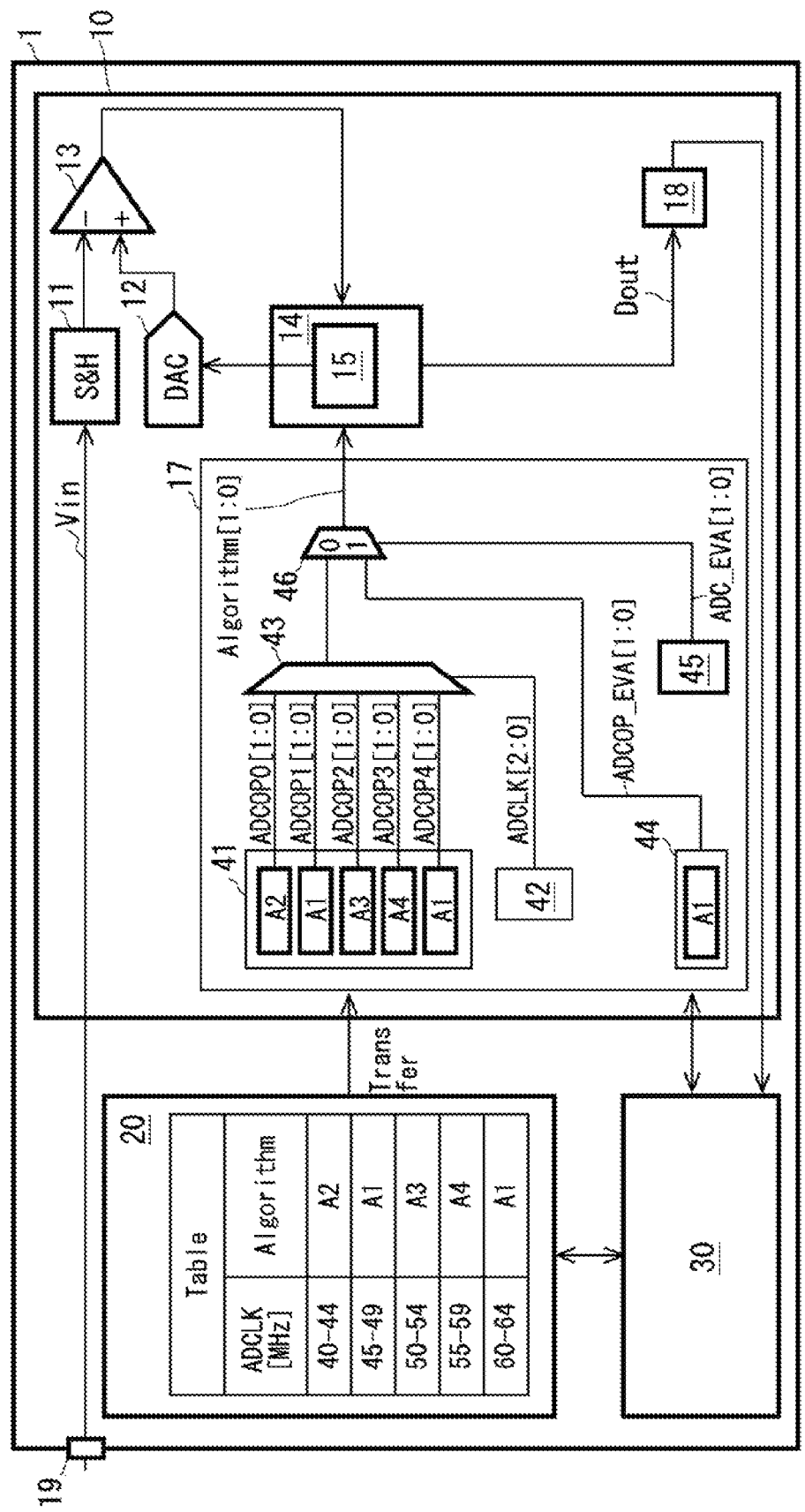
FIG. 10 is a block diagram exemplifying a semiconductor device including an A/D converter according to the first embodiment.

FIG. 10 is a block diagram exemplifying a semiconductor device including the A/D converter according to the first embodiment. As shown in FIG. 10, the plurality of successive approximation algorithms stored in the successive approximation algorithm setting register 41 may be transferred from the storage unit 20. Therefore, in conjunction with the frequency of the clock ADCLK set by a user(s), it is possible to automatically switch to the successive approximation algorithm precedingly associated as the optimum algorithm for the frequency. This makes it possible to improve the A/D conversion accuracy.

Further, even if the frequency dependency of the clock ADCLK for improving the A/D conversion accuracy differs depending on products such as the semiconductor device 1 and the A/D converter 10, the combination of the plurality of optimum successive approximation algorithms from the storage unit 20 for each product is transferred, which can improve the A/D conversion accuracy.

Second Embodiment

Next, an A/D converter and a semiconductor device according to a second embodiment will be described. In an A/D converter of this embodiment, a user evaluates and determines a plurality of successive approximation algorithms stored in the successive approximation algorithm setting register 41 and respective frequencies corresponding thereto.

Figure 11:
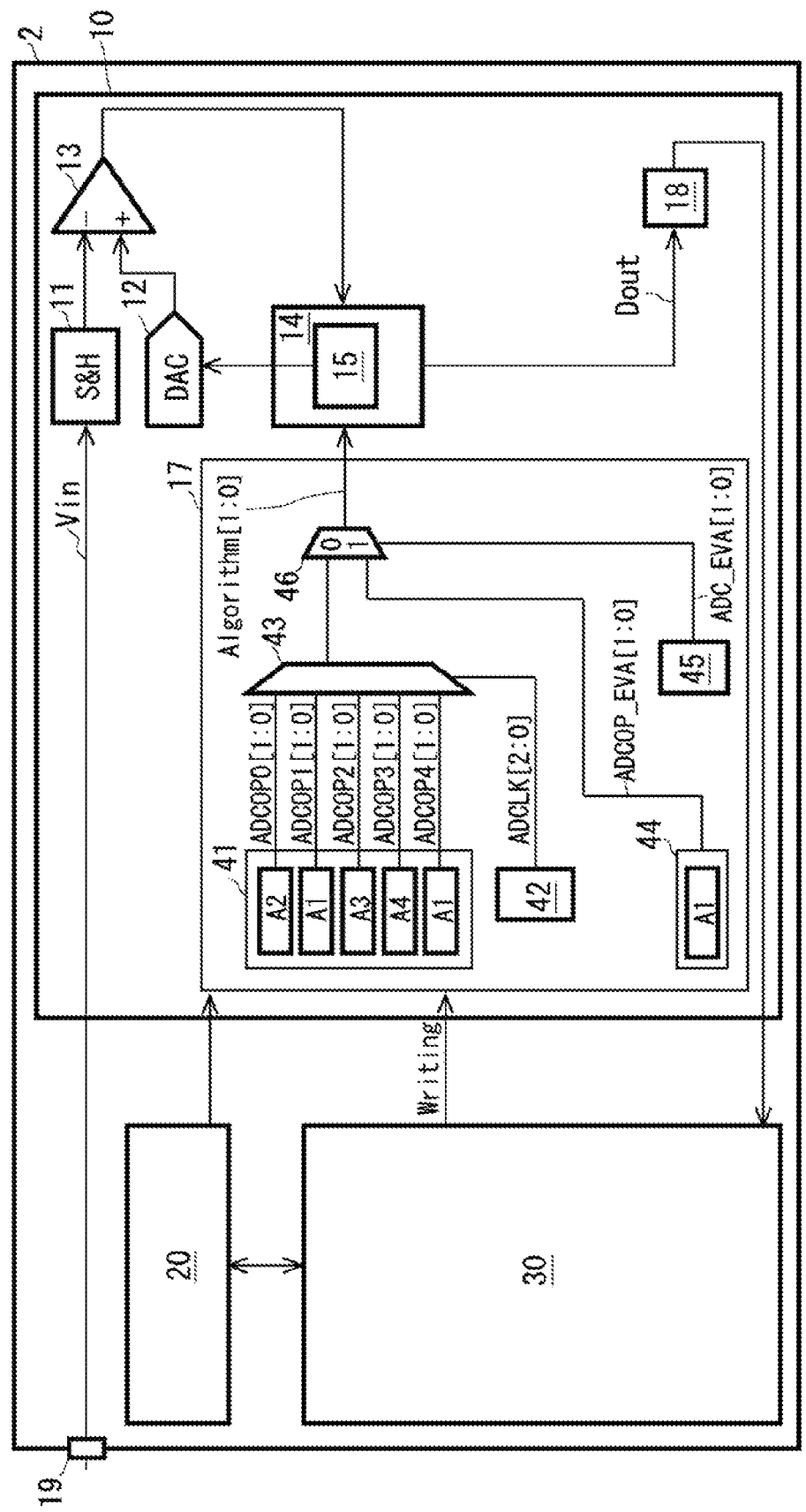
FIG. 11 is a block diagram exemplifying a semiconductor device including an A/D converter according to a second embodiment.

FIG. 11 is a block diagram exemplifying a semiconductor device including an A/D converter according to the second embodiment. As shown in FIG. 11, for example, in an A/D converter 10 of a semiconductor device 2, the user causes the evaluation mode setting register 45 to output the evaluation mode setting information, and sets a mode selection unit 46 to an evaluation mode. This allows the user to determine the optimum combination of the successive approximation algorithms with respect to each frequency of the clock ADCLK in a user's actual usage environment. The user may then determine a table of the successive approximation algorithms as shown in FIG. 9. The user may operate the processor 30 and cause it to write the determined combination of the successive approximation algorithms to the successive approximation algorithm setting register 41. The processor 30 writes the combinations of the plurality of successive approximation algorithms and the respective frequencies associated with each successive approximation algorithm to the successive approximation algorithm setting register.

Therefore, in the successive approximation algorithm setting register 41 of the present embodiment, the combinations of the plurality of successive approximation algorithms and the respective frequencies are written by the processor 30 that operates according to user's settings. According to the present embodiment, the successive approximation algorithm of the A/D converter 10 can be adapted to the user's actual usage environment. Therefore, it is possible to apply the optimum successive approximation algorithm in an actual usage environment of users such as customers, and improve the A/D conversion accuracy.

Modification Example

Incidentally, the mode selection unit 46 may switch not only to the A/D conversion mode and the evaluation mode but also to an all-frequency handling mode. An all-frequency handling mode is used regardless of the frequency without making the successive approximation algorithm depend on the frequency of the clock ADCLK as in the evaluation mode. That is, the successive approximation algorithm is used at all the frequencies of the used clock ADCLK.

Figure 12:
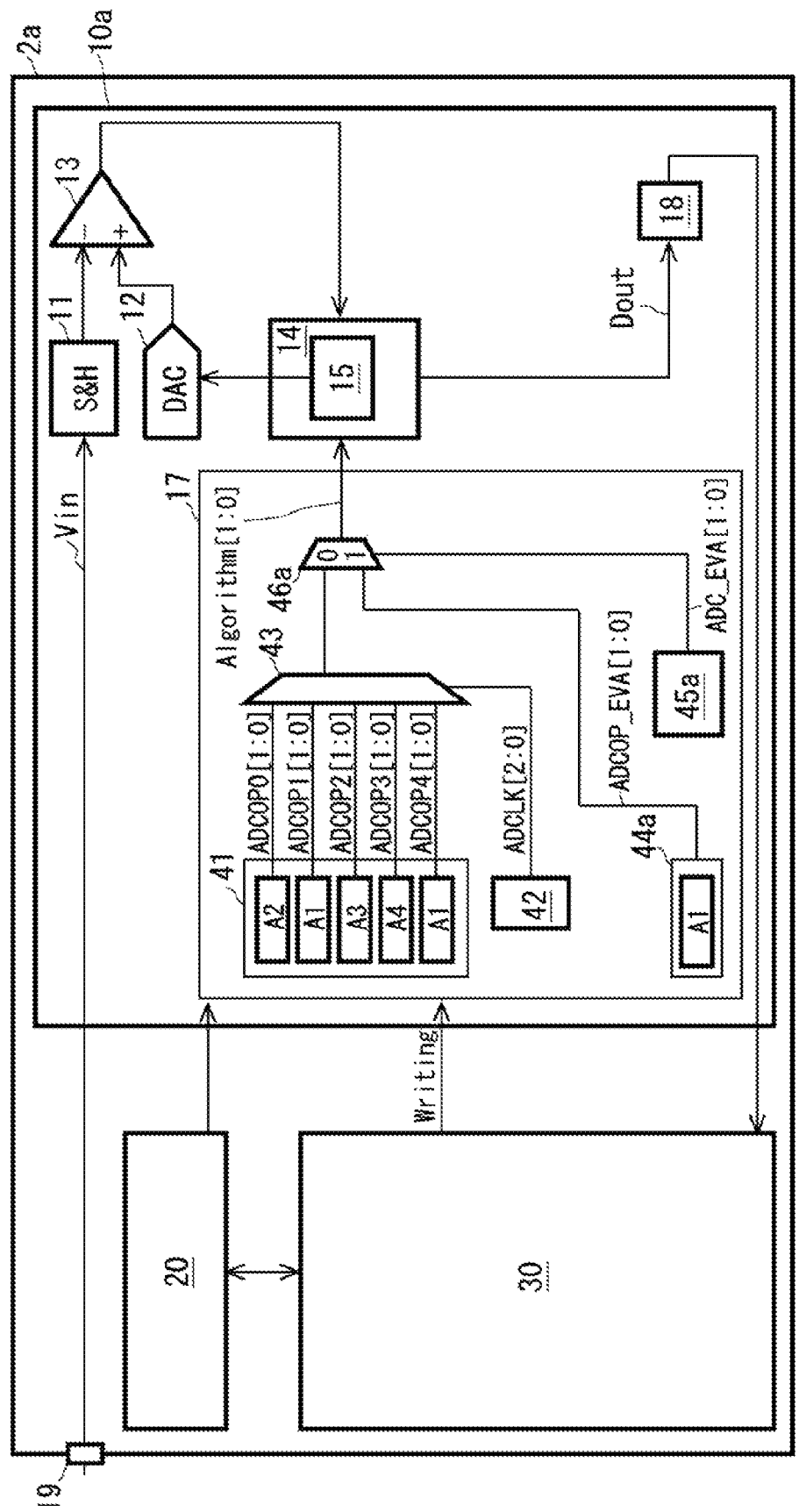
FIG. 12 is a block diagram exemplifying a semiconductor device including an A/D converter according to a modification example of the second embodiment.

FIG. 12 is a block diagram exemplifying a semiconductor device including an A/D converter according to a modification example of the second embodiment. As shown in FIG. 12, a semiconductor device 2a includes an A/D converter 10a, a storage unit 20, a processor 30, and a terminal 19. The A/D converter 10a has a frequency handling successive approximation algorithm setting register 44a and a mode setting register 45a instead of the evaluation successive approximation algorithm setting register 44 and the evaluation mode setting register 45 in the A/D converter 10.

The frequency handling successive approximation algorithm setting register 44a stores a frequency handling successive approximation algorithm corresponding to all the frequencies of the used clock ADCLK. That is, the frequency handling successive approximation algorithm setting register 44a stores the frequency handling successive approximation algorithm used over each frequency associated with the plurality of successive approximation algorithms.

The mode setting register 45a outputs mode setting information, which sets a mode corresponding to all the frequencies, to the frequency handling successive approximation algorithm regardless of the frequency of the clock ADCLK. The mode selection unit 46a selects, based on the mode setting information outputted from the mode setting register 45a, either the frequency handling successive approximation algorithm or the predetermined successive approximation algorithm selected by the algorithm selection unit 43. When the mode selection unit 46a selects the frequency handling successive approximation algorithm, the control circuit 14 generates a comparison value from the comparison result of the comparator 13 based on the selected frequency handling successive approximation algorithm.

According to this modification example, it can switch between a mode of the A/D conversion by using the successive approximation algorithm selected depending on the frequency of the clock ADCLK and an A/D conversion mode by using a specific successive approximation algorithm regardless of the frequency of the clock ADCLK. Therefore, switching of the successive approximation algorithm depending on the frequency of the clock ADCLK can be enabled or disabled. Configurations and effects other than this are included in the description of the first embodiment.

Third Embodiment

Figure 13:
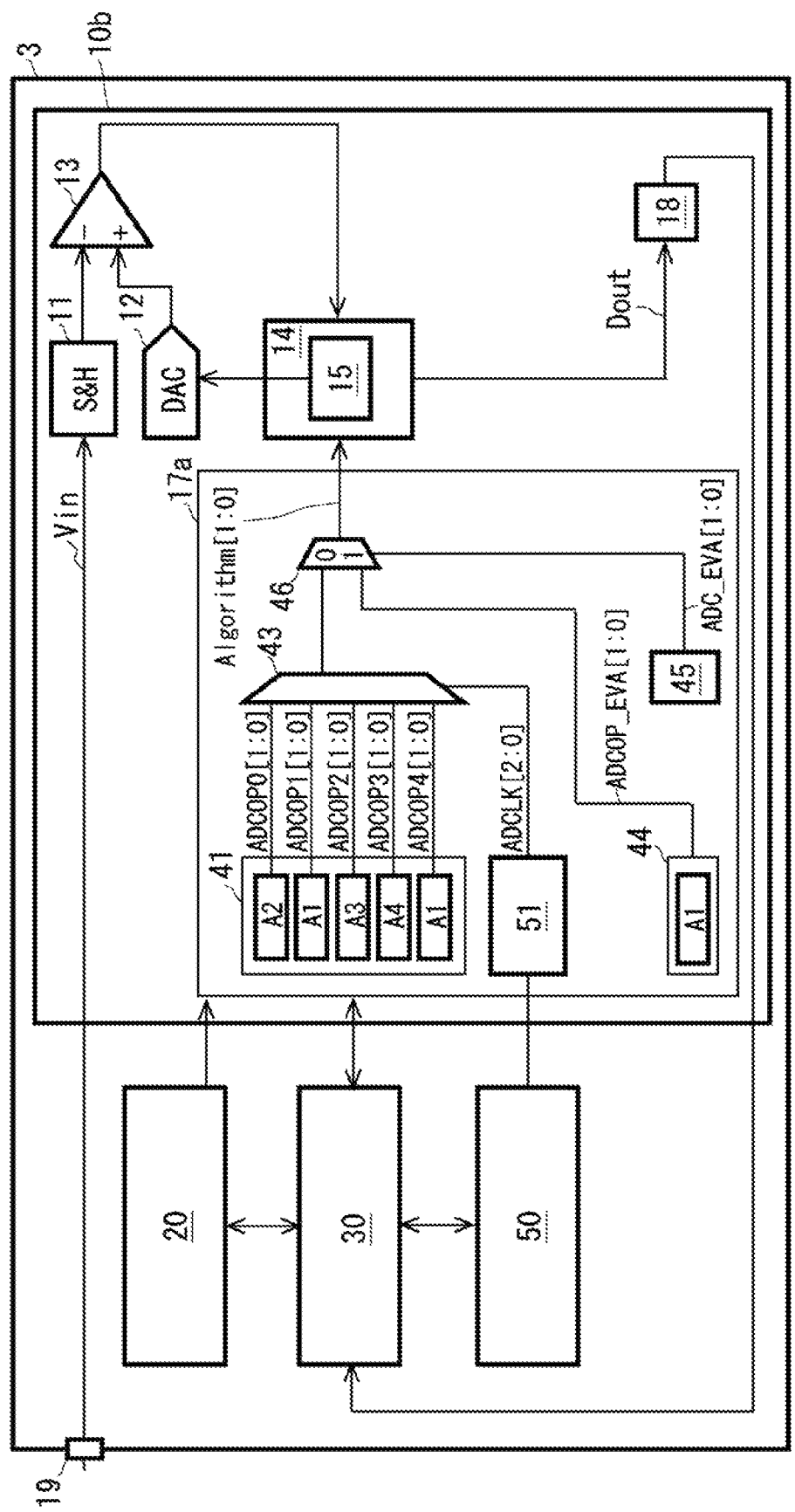
FIG. 13 is a block diagram exemplifying a semiconductor device including an A/D converter according to a third embodiment.

Next, an A/D converter and a semiconductor device according to a third embodiment will be described. A semiconductor device of this embodiment includes a clock control circuit that controls the frequency of the clock ADCLK. FIG. 13 is a block diagram exemplifying a semiconductor device including an A/D converter according to the third embodiment;

As shown in FIG. 13, a semiconductor device 3 further includes a clock control circuit 50 in addition to the A/D converter 10b, the storage unit 20, the processor 30, and the terminal 19. The clock control circuit 50 is also called a clock control device that functions as a single unit. The clock control circuit 50 controls the frequency of the clock ADCLK of the semiconductor device 3 including the A/D converter 10. The clock control circuit 50 may automatically change the frequency of the clock ADCLK based on conditions set in the semiconductor device 3 in advance.

The A/D converter 10b has an A/D conversion control register 17a instead of the A/D conversion control register 17 in the A/D converter 10. The A/D conversion control register 17a has a clock control unit 51 instead of the clock setting register 42 in the A/D conversion control register 17a. The clock control unit 51 detects a change in the frequency of the clock ADCLK, and outputs the frequency information to the algorithm selection unit 43 based on the detected frequency. The algorithm selection unit 43 selects the successive approximation algorithm based on the frequency information outputted from the clock control unit 51.

According to this embodiment, the A/D converter 10b has the clock control unit 51, and so can detect the change in the frequencies of the clock ADCLK even if the frequency of the clock ADCLK changes automatically. Therefore, the algorithm selection unit 43 can switch the successive approximation algorithm according to the change in frequencies. This makes it possible to improve the A/D conversion accuracy. Configurations and effects other than this are included in the descriptions of the first and second embodiments.

The invention made by the present inventor has been specifically described above based on the embodiments, but the present invention is not limited to the above embodiments and, needless to say, can be variously modified without departing from the scope of the invention. Also, each combination of the configurations of the first to third embodiments and the modification examples is within the scope of the technical idea.

What is claimed is:

1. An A/D converter comprising:
    a successive approximation algorithm setting register storing a plurality of successive approximation algorithms;
    an algorithm selection unit selecting a predetermined successive approximation algorithm from the plurality of successive approximation algorithms;
    a control circuit generating a comparison value based on the selected predetermined successive approximation algorithm;
    a DAC generating a comparison voltage from the comparison value;
    a comparator making a comparison of an analog input voltage and the comparison voltage; and
    a clock setting register outputting clock frequency information indicating operational timing,
    wherein the control circuit:
        generates the comparison value from a result of the comparison made by the comparator based on the selected predetermined successive approximation algorithm; and
        converses the analog input voltage into a digital signal from the result of the comparison made by the comparator only at least a number of times equal to a number of bits of digital signals, and
    wherein the algorithm selection unit selects the predetermined successive approximation algorithm based on the frequency information outputted from the clock setting register.

2. The A/D converter according to claim 1,
    wherein the plurality of successive approximation algorithms stored in the successive approximation algorithm setting register is written in a storage unit in advance, thereby being transferred from the storage unit that store combinations of the plurality of successive approximation algorithms and respective frequencies associated with the respective successive approximation algorithms.

3. The A/D converter according to claim 1, further comprising:
    an evaluation successive approximation algorithm setting register storing an evaluation successive approximation algorithm to be evaluated;
    an evaluation mode setting register outputting evaluation mode setting information that sets an evaluation mode; and
    a mode selection unit selecting either the evaluation successive approximation algorithm or the predetermined successive approximation algorithm selected by the algorithm selection unit based on evaluation mode setting information outputted from the evaluation mode setting register,
    wherein the evaluation successive approximation algorithm is evaluated over respective frequencies associated with the plurality of successive approximation algorithms, and
    wherein when the mode selection unit selects the evaluation successive approximation algorithm, the control circuit selects the comparison value from the result of the comparison of the comparator based on the selected evaluation successive approximation algorithm.

4. The A/D converter according to claim 1, further comprising:
    a frequency handling successive approximation algorithm setting register storing a frequency handling successive approximation algorithm used over respective frequencies associated with the plurality of successive approximation algorithms;
    a mode setting register outputting mode setting information that sets a mode; and
    a mode selection unit selecting either a frequency handling successive approximation algorithm or the predetermined successive approximation algorithm selected by the algorithm selection unit based on the mode setting information outputted from the mode setting register,
    wherein when the mode selection unit selects the frequency handling successive approximation algorithm, the control circuit generates the comparison value from the result of the comparison of the comparator based on the selected frequency handling successive approximation algorithm.

5. The A/D converter according to claim 1, wherein the successive approximation algorithm setting register writes, by a processor operating according to user's setting, combinations of the plurality of successive approximation algorithms and respective frequencies associated with the respective successive approximation algorithms.

6. The A/D converter according to claim 1, further comprising a clock control unit detecting a change in frequencies of the clock controlled by a clock control device and outputting the frequency information based on the detected frequencies, wherein the algorithm selection unit selects the predetermined successive approximation algorithm based on the frequency information outputted from the clock control unit.

7. The A/D converter according to claim 1,
    wherein the plurality of successive approximation algorithms include at least one of a binary search algorithm and a redundancy algorithm,
    in comparisons made the number of times equal to the number of bits of the digital signal, the binary search algorithm sequentially changing a change amount, by which the comparison value is sequentially changed, starting from ½ of a maximum value of the digital signal and halving the change amount with each subsequent comparison, and the binary search algorithm adding or subtracting the change amount to or from the comparison value according to the result of the comparison of the comparator, and the redundancy algorithm inserting a same redundant comparison as the immediately preceding comparison at least between the comparison and the comparisons performed the number of times equal to the number of bits of the binary search algorithm and/or after the comparison made the number of times equal to the number of bits.

8. The A/D converter according to claim 7,
wherein the plurality of successive approximation algorithms include a plurality of redundancy algorithms composed of the redundant algorithm, and
wherein each of the redundancy algorithms differs from each other in at least one of a position and a number of the redundant comparison arranged.

9. A semiconductor device comprising an A/D converter, wherein the A/D converter includes:
   a successive approximation algorithm setting register storing a plurality of successive approximation algorithms;
   an algorithm selection unit selecting a predetermined successive approximation algorithm from the plurality of successive approximation algorithms;
   a control circuit generating a comparison value based on the selected predetermined successive approximation algorithm; and
   a DAC generating a comparison voltage from the comparison value; and
   a comparator making a comparison of an analog input voltage and a comparison voltage,
   wherein the control circuit:
      generates the comparison value from a result of the comparison made by the comparator based on the selected predetermined successive approximation algorithm; and
      converts the analog input voltage into a digital signal from the result of the comparison made by the comparator at least a number of times equal to a number of bits of the digital signal,
   wherein the A/D converter further has a clock setting register that outputs clock frequency information indicating operational timing, and
   wherein the algorithm selection unit selects the predetermined successive approximation algorithm based on the frequency information outputted from the clock setting register.

10. The semiconductor device according to claim 9, further comprising a storage unit storing, by being written in advance, combinations of the plurality of successive approximation algorithms and respective frequencies associated with the plurality of successive approximation algorithms,
   wherein the plurality of successive approximation algorithms stored in the successive approximation algorithm setting register are transferred from the storage unit.

11. The semiconductor device according to claim 9, wherein the A/D converter further includes:

an evaluation successive approximation algorithm setting register storing an evaluation successive approximation algorithm to be evaluated;
an evaluation mode setting register outputting evaluation mode setting information that sets an evaluation mode; and
a mode selection unit selecting either the evaluation successive approximation algorithm or the predetermined successive approximation algorithm selected by the algorithm selection unit based on the evaluation mode setting information outputted from the evaluation mode setting register,
wherein the evaluation successive approximation algorithm is evaluated over each of frequencies associated with the plurality of successive approximation algorithms, and
wherein when the mode selection unit selects the evaluation successive approximation algorithm, the control circuit generates the comparison value from the result of the comparison of the comparator based on the selected evaluation successive approximation algorithm.

12. The semiconductor device according to claim 9, wherein the A/D converter further has:
   a frequency handling successive approximation algorithm setting register storing frequency handling successive approximation algorithms used across each of the frequencies associated with the plurality of successive approximation algorithms;
   a mode setting register outputting mode setting information that sets a mode; and
   a mode selection unit selecting either the frequency handling successive approximation algorithm or the predetermined successive approximation algorithm selected by the algorithm selection unit based on the mode setting information outputted from the mode setting register, and
   wherein when the mode selection unit selects the frequency handling successive approximation algorithm, the control circuit generates the comparison value from the result of the comparison of the comparator based on the selected frequency handling successive approximation algorithm.

13. The semiconductor device according to claim 9, further comprising a processor operated at user's settings,
   wherein the processor writes, to the successive approximation algorithm setting register, combinations of the plurality of successive approximation algorithms and the respective frequencies associated with the respective successive approximation algorithms to the successive approximation algorithm setting register.

14. The semiconductor device according to claim 9, further comprising a clock control circuit controlling a frequency of the clock,
   wherein the A/D converter further has a clock control unit detecting a change in the frequency of the clock and outputs the frequency information based on the detected frequency, and
   wherein the algorithm selection unit selects the predetermined successive approximation algorithm based on the frequency information outputted from the clock control unit.

15. The semiconductor device according to claim 9, wherein the plurality of successive approximation algorithms include at least of one of a binary search algorithm and a redundancy algorithm, the binary search algorithm sequentially changing a change amount, which sequentially changes the comparison value, starting from ½ of a maximum value of the digital signal and halving the change amount with each subsequent comparison, and the binary search algorithm adding or subtracting the change amount to or from the comparison value, and the redundant algorithm inserting a same redundant comparison as the immediately preceding comparison at least between the comparison and the comparisons performed the number of times equal to the number of bits and after the comparisons performed the number of times equal to the number of bits in the binary search algorithm.

16. The semiconductor device according to claim 15, wherein the plurality of successive approximation algorithms include a plurality of redundancy algorithms composed of the redundant algorithm, and wherein each of the redundancy algorithms differs from each other in at least one of a position and a number of the redundant comparison arranged.

* * * * *